US006207582B1

United States Patent
Shields et al.

(10) Patent No.: US 6,207,582 B1
(45) Date of Patent: Mar. 27, 2001

(54) NATIVE OXIDE REMOVAL WITH FLUORINATED CHEMISTRY BEFORE COBALT SILICIDE FORMATION USING NITRIDE SPACERS

(75) Inventors: Jeffrey A. Shields, Sunnyvale; Bharath Rangarajan, San Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,767

(22) Filed: Jul. 21, 1999

(51) Int. Cl.⁷ .................. H01L 21/301; H01L 21/461
(52) U.S. Cl. .................................................... 438/723
(58) Field of Search .................... 438/723, 683, 438/631; 216/68, 58

(56) References Cited

U.S. PATENT DOCUMENTS 5,843,847 * 12/1998 Pu et al. .............................. 438/723
5,856,237 * 6/1999 Ku ...................................... 438/683
5,888,414 * 3/1999 Collins et al. ......................... 216/68
5,914,001 * 6/1999 Hansen ................................ 156/345
5,973,908 * 10/1999 Sala et al. ............................ 361/311
5,990,000 * 11/1999 Hong et al. .......................... 438/631
6,071,825 * 6/2000 Deferm ............................... 438/719

* cited by examiner

Primary Examiner—Matthew Smith
Assistant Examiner—Calvin Lee
(74) Attorney, Agent, or Firm—Foley & Lardner

(57) ABSTRACT

A native oxide removal process utilizes a fluorinated plasma used in a sputter etch in order to remove the native oxide prior to a cobalt oxide formation process is initiated. The fluorinated plasma, such as CF4, is performed at between 50 to 100 volts bias on a substrate on which the native oxide is to be removed, and is performed in-situ. The fluorinated plasma provides both a chemical and a physical etching of the native oxide, without harming a gate oxide layer. The substrate is formed with nitride spacers and not oxide spacers, in order to lessen the possibility of any oxide being resputtered into the region in which the native oxide layer is being removed.

1 Claim, 1 Drawing Sheet

NATIVE OXIDE REMOVAL WITH FLUORINATED CHEMISTRY BEFORE COBALT SILICIDE FORMATION USING NITRIDE SPACERS

BACKGROUND OF THE INVENTION

1. Field of the Invention

The present invention relates to native oxide removal that is done prior to a cobalt silicide formation on a semiconductor substrate. In particular, the present invention relates to native oxide removal by using a fluorinated plasma and by using nitride spacers on the substrate.

2. Description of the Related Art

Cobalt silicide formation is used for providing a good contact for source and drain regions within a silicon substrate. A cobalt silicide layer, which is a layer having good conductive properties, is formed above the source or drain regions, and an electrical contact is made to the source or drain regions by contacting the cobalt silicide layer. For complete cobalt (or nickel or titanium) silicide formation, the silicon surface must be free of oxide before the cobalt deposition. The cobalt silicide layer is formed on a polysilicon gate (or stack), in order to lower a resistance of the polysilicon (or 'poly'), and it also is formed on exposed silicon regions of the substrate where source and drain regions are to be formed. The cobalt silicide layer forms a good contact to those source and drain regions, and also lower the resistance of a conductive path to those layers.

For a typical cobalt deposition process, the cobalt (or nickel or titanium) is deposited over the entire wafer. This provides cobalt on top of bare silicon areas that are source regions and drain regions. The cobalt is also provided over gate regions, or stacks, and over oxide materials, with those oxide materials being either sealed oxide or spacer materials which act as insulators.

Once the cobalt is deposited, the wafer is subjected to a rapid thermal anneal (RTA), where it is heated up. This reacts the cobalt with the exposed silicon, and cobalt silicide is formed as a result. In those areas of the wafer where cobalt is not in contact with silicon but rather is in contact with oxide (e.g., native oxide layer), either nothing happens or cobalt oxide is formed. Cobalt oxide is nonconducting.

Then, the wafer is subjected to a wet chemical process that strips off cobalt and cobalt oxide but does not strip off cobalt silicide. This results in the stripping off of excess cobalt in areas which are not in contact with the silicon, with those areas including areas where the cobalt was deposited on top of oxide. What is left is a cobalt silicide layer that exists over exposed silicon, where source and drain regions are to be (or have been) formed.

Then, the wafer is placed back into an RTA system, and taken to an even hotter temperature, so as to make the cobalt silicide have a proper grain structure to ensure good conductivity. Precise details of the environmental parameters and process times for each of these steps are known to those skilled in the art, and are not provided herein so as to more clearly describe the present invention, which deals with a process that is performed prior to the cobalt deposition step.

Prior to the cobalt deposition step, it is important that the areas in which cobalt silicide is to be formed, such as areas in which a source and a drain region are formed within a substrate, have exposed silicon on their top surfaces. Thus, a good clean step is required in order to provide for exposed silicon in particular areas of a substrate, since any oxide remaining in those areas will cause problems in the cobalt silicide formation process, as explained above.

A first conventional method for cleaning prior to cobalt deposition corresponds to a high-bias argon sputter etch, which is performed in-situ. FIG. 1 shows a wafer after it has been subjected to a high-bias argon sputter etch. In FIG. 1, gate region 110 and gate region 120 have gate oxide layers 130, 140, respectively, which form an insulating layer with respect to the substrate 100, where source and drain regions are formed within the substrate 100. After the high-bias argon sputter etch, which is typically performed with a 250 volt bias, damage is caused in the gate oxide layers 130, 140 as a result of using such a high bias voltage, even though the area 150 between the gate regions 110, 120 in which source and drain regions are formed (not shown) has been cleaned of any oxide, thereby leaving an exposed silicon surface that is desirable for a cobalt deposition step to be performed subsequently.

A second conventional method for cleaning prior to cobalt deposition corresponds to a low-bias argon sputter etch, which is performed in-situ. FIG. 2 shows a wafer after it has been subjected to a low-bias argon sputter etch. In FIG. 2, gate region 110 and gate region 120 have gate oxide layers 130, 140, respectively, which form an insulating layer with respect to a top surface of the substrate 100, where source and drain regions are formed within the substrate 100. After the low-bias argon sputter etch, which is typically performed with a 50 volt bias, the gate oxide layers 130, 140 are not damaged as in the first conventional method, but due to the low-bias voltage, the area 150 has redeposited oxide 160 formed thereon. The redeposited oxide 160 is formed from the spacers 185, 188 surrounding the gate regions 110, 120, whereby part of the spacers 185, 188 is sputtered off and ends up on top of the area 150. This is undesirable, since exposed silicon is not present on a portion of the substrate 100 where a source and a drain region are formed.

Thus, the first conventional method provides for a clean oxide-free substrate surface over source and drain areas so as to allow for proper cobalt silicide formation when cobalt is deposited onto the substrate, but at the expense of causing some damage to the gate oxide layers. The second conventional method does not damage the gate oxide layers, but also does not provide for a clean oxide-free substrate surface over the source and drain areas.

Therefore, a better process for preparing a substrate for a later-performed cobalt silicide formation process is desired.

SUMMARY OF THE INVENTION

An object of the invention is to provide for substantial native oxide removal before a cobalt deposition is performed on a semiconductor substrate.

Another object of the invention is to provide for substantial native oxide removal without adversely affecting other portions of a semiconductor substrate before a cobalt deposition is performed on the semiconductor substrate.

At least some of the above-mentioned objects and other advantages may be achieved by an oxide removal method for a semiconductor substrate that includes a polysilicon stack with a gate oxide layer formed between a top surface of the substrate and the stack and with a native oxide layer formed on the substrate on portions of the top surface of the substrate where the polysilicon stack is not located. The method includes providing at least one nitride spacer on the substrate. The method also includes providing a fluorinated sputter etch at a bias voltage of between 50 volts and 100 volts in order to remove the native oxide layer without substantially affecting the gate oxide layer.

BRIEF DESCRIPTION OF THE DRAWINGS

These and other objects and advantages of the invention will become more fully apparent from the following detailed description when read in conjunction with the accompanying drawings with like reference numerals indicating corresponding parts throughout, and wherein.

DETAILED DESCRIPTION OF THE PREFERRED EMBODIMENTS

Figure 1:
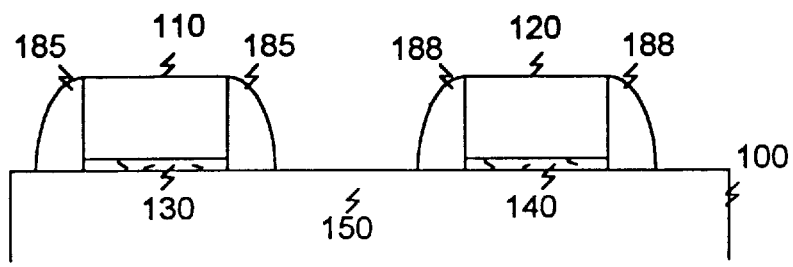
FIG. 1 illustrates a semiconductor substrate after a high-bias argon etch has been performed according to a first conventional method.
Figure 2:
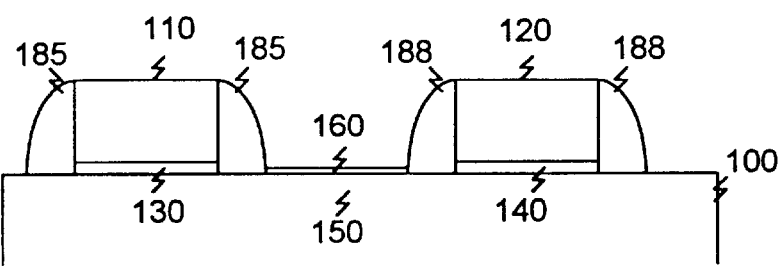
FIG. 2 illustrates a semiconductor substrate after a low-bias argon etch has been performed according to a second conventional method.
Figure 3:
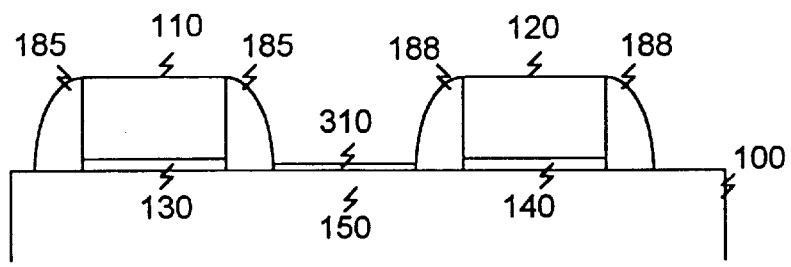
FIG. 3 illustrates a semiconductor substrate prior to having a pre-cobalt-deposition cleaning step performed.

Preferred embodiments of the present invention will be described in detail hereinbelow, with reference to the accompanying drawings. In FIG. 3, gate region 110 and gate region 120 have gate oxide layers 130, 140, respectively, which form an insulating layer with respect to a top surface of the substrate 100, where source and drain regions are formed within the substrate 100. The gate oxide layers are typically on the order of from 25 to 200 angstroms, but other sizes are possible based on the integrated circuit formation process being used, as is known to those skilled in the art. FIG. 3 also shows an area 150 between the gate regions 110, 120 in which source and drain regions (not shown) are formed. A native oxide layer 310 is formed over the area 150. The native oxide layer 310 is typically formed when the substrate is exposed to air, and grows to a size of between 5 to 10 angstroms typically, though other sizes are possible. The size of this native oxide layer 310 is large enough to adversely affect a cobalt silicide formation process to be performed at a later time, and so it is desirable to remove this native oxide layer 310.

Unlike the conventional methods of native oxide removal (or cleaning) whereby the argon sputter etch provides for a physical removal of some or all of the native oxide layer by bombardment of the native oxide layer, the is present invention utilizes a sputter chemistry that performs both physically active (e.g., bombards) and chemically active with respect to the native oxide layer.

A first embodiment of the present invention uses a fluorinated plasma which is applied to the substrate in-situ. The fluorinated plasma may be CF4, SF6, NF3, C2F6, C4F8, CHF3, CH3F, or other types of fluorinated plasmas that are used to etch oxide layers while being fairly etch resistant to other adjacent layers that are not oxide-based.

Figure 4:
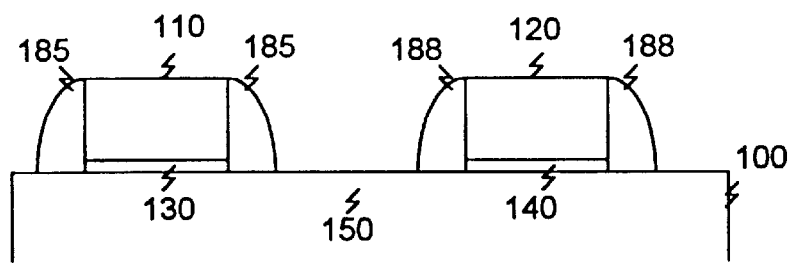
FIG. 4 illustrates a semiconductor substrate after a fluorinated plasma sputter etch has been performed in accordance with the present invention.

FIG. 4 illustrates a semiconductor substrate after a fluorinated plasma sputter etch has been performed in accordance with the first embodiment of the present invention. In FIG. 4, the native oxide layer is no longer present, and the gate oxide layers 130, 140 respectively disposed under the gate regions 110, 120 are undamaged. In FIG. 4, the spacers surrounding the gate oxide layers 130, 140 are also undamaged.

The fluorinated plasma is preferably applied to a semiconductor substrate having a bias voltage of between 50 to 100 volts. This range is higher than what is used for conventional low-bias argon sputter etches, and is lower than what is used for conventional high-bias argon sputter etches. With such a bias voltage and with such an etch plasma, very little if any sputter redeposition of insulating spacer material occurs (unlike the second conventional method), while very little if any damage occurs to the gate oxide layers (unlike the first conventional method).

The other process parameters that are utilized in a preferred method for removing a native oxide layer include RF power levels in the range of from 100 to 300 watts, chamber pressure in the range of from 1 to 50 mT, and gas flow in the range of from 5 to 50 sccm. The gas flow range is similar to what is used in the conventional methods of argon sputter etching of a native oxide layer.

The native oxide removal process according to the invention is performed in-situ, preferably using a cluster tool that has multiple chambers that can be placed in a vacuum state. As such, once the native oxide removal has been done in one of the multiple chambers in accordance with the present invention, the cleaned substrate is moved to another of the chambers, without breaking the vacuum, so as to perform a cobalt deposition in a first step of a cobalt silicide formation. The movement of a substrate from one chamber to another chamber in a cluster tool is known to those skilled in the art, such as the use of a robotic arm, for example, and is not described in detail since it is not an important aspect of the present invention.

The use of fluorine chemistries in the native oxide removal process provides for etching of the native oxides in a chemical sense, and the biasing of the substrate at an intermediate level with respect to that used in the conventional argon sputter etches provides for etching of the native oxides in a physical (bombardment) sense. The biasing voltage of the substrate is chosen so as to achieve some physical etching of the native oxide layer, without damaging the gate oxide layers.

In a second embodiment, which is the same as the first embodiment except that no bias is provided to the substrate, only chemical etching of the native oxide layer is performed by the application of a fluorinated plasma in-situ. This embodiment may not clean the native oxide layer as well as is done in the first embodiment, but is a simpler implementation and also ensures that no damage occurs to the gate oxide layer during the cleaning of the native oxide layer using a fluorinated plasma.

In a third embodiment, referring again to FIG. 4, the spacers 185, 188 are nitride spacers, so as to allow for a more aggressive removal of the native oxide than is available in either of the first and second embodiments, which allow for the spacers to be either oxide-based or nitride-based. The structure according to the third embodiment will help ensure that that the exposed silicon areas on the substrate are free from native oxide and will reduce the risk of redeposited spacer material, since very little if any of the nitride-based spacer material will be removed by the use of a fluorinated plasma in accordance with the present invention.

Also, with the first and second embodiment, when oxide spacers are utilized, there is a potential problem in that the oxide spacers may be thinned somewhat when the native oxide layer is removed. This thinning of the oxide spacers may affect proper operation of the gate stacks. However, by utilizing nitride spacers as opposed to oxide spacers on the substrate, this potential problem goes away. When nitride spacers are used, the oxide can be etched with a chemical that is selective to nitride, and thus gives a greater range of etch chemistry choices than is available in the first and second embodiments, as well as a greater flexibility in the process environmental parameters.

While preferred embodiments have been described herein, modification of the described embodiments may become apparent to those of ordinary skill in the art, following the teachings of the invention, without departing from the spirit and scope of the invention as set forth in the appended claims.

What is claimed is:

1. An oxide removal method for a semiconductor substrate that has a native oxide layer formed thereon and nitride spacers formed adjacent to polysilicon stacks that correspond to gate regions of a transistor to be formed on the substrate, the method comprising:
performing a sputter etch using a fluorinated plasma to remove the native oxide layer from the substrate,
wherein no bias is provided on the substrate during the sputter etch.

* * * * *